(12) United States Patent  
Jiang

(10) Patent No.: US 7,928,788 B2  
(45) Date of Patent: Apr. 19, 2011

(54) DOUBLE-BALANCED SINUSOIDAL MIXING PHASE INTERPOLATOR CIRCUIT AND METHOD

(75) Inventor: Xuewen Jiang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 12/183,563

(22) Filed: Jul. 31, 2008

(65) Prior Publication Data

US 2010/0026367 A1 Feb. 4, 2010

(51) Int. Cl.  
*H03H 11/16* (2006.01)

(52) U.S. Cl. ........ 327/231; 327/234; 327/246; 327/359; 330/252; 330/253; 455/323; 455/326

(58) Field of Classification Search .................. 327/231, 327/234–235, 237, 245–247, 266, 274, 280, 327/357, 359–361, 560–562; 330/252, 253  
See application file for complete search history.

(56) References Cited

U.S. PATENT DOCUMENTS

| | | | |
|---|---|---|---|
| 3,774,115 A | 11/1973 | Greiner | |
| 3,940,635 A | 2/1976 | Meyer | |
| 3,982,189 A | 9/1976 | Brooks et al. | |
| 4,250,455 A | 2/1981 | Davis | |
| 5,151,624 A * | 9/1992 | Stegherr et al. | 327/356 |
| 5,625,318 A * | 4/1997 | Sevenhans et al. | 327/563 |
| 5,841,384 A * | 11/1998 | Herman et al. | 341/138 |
| 5,945,860 A * | 8/1999 | Guay et al. | 327/246 |
| 6,943,606 B2 * | 9/2005 | Dunning et al. | 327/231 |
| 7,298,195 B2 * | 11/2007 | Freyman et al. | 327/247 |
| 7,315,596 B2 | 1/2008 | Payne et al. | |
| 7,579,891 B2 * | 8/2009 | Ebner | 327/237 |

OTHER PUBLICATIONS

Shin, Soon-Kyun, et al.: Slew-Rate-Controlled Output Driver Having Constant Transition Time Over Process, Voltage, Temperature, and Output Load Variations; IEEE Transactions on Circuits and Systems; Jul. 2007; pp. 601-605; vol. 54, No. 7; IEEE.

Zhu, Qing K., et al.; Delay/Slope Budgeting for Clock Buffer Cell Design; 8th IEEE International Conference on Electronics, Circuits, and Systems; 2001; pp. 417-420; IEEE.

Heydari, Payam, et al.; Design of Ultra High-Speed CMOS CML Buffers and Latches; Proceedings of the 2003 International Symposium onm Circuits and Systems; May 25-28; pp. II-208 thru II-211; IEEE.

U.S. Appl. No. 12/183,550; Non-Final Office Action dated Sep. 17, 2009.

(Continued)

*Primary Examiner* — An T Luu

(57) ABSTRACT

A double-balanced sinusoidal mixing phase interpolator circuit comprises: a double-balanced gain stage having a first input for receiving a first phasor clock, a second input for receiving a second phasor clock, and a phase interpolator (PI) output, wherein the double-balance gain stage includes (i) a first gain stage having a positive input side and a negative input side for the first phasor clock and (ii) a second gain stage having a positive input side and a negative input side for the second phasor clock; and a sinusoidal digital-to-analog (DAC) stage coupled to the double-balanced gain stage and configured to implement sinusoidal weighting of positive and negative sides of differential DAC current for the first phasor clock and positive and negative sides of differential DAC current for the second phasor clock, wherein the sinusoidal weighting provides uniformly spaced phase steps in the phase interpolator (PI) output.

18 Claims, 7 Drawing Sheets

OTHER PUBLICATIONS

Bulzacchelli, John F. et al.; "A 10-Gb/s 5-Tap DFE/4-Tap FFE Transceiver in 90-nm CMOS Technology"; IEEE Journal of Solid State Circuits; Dec. 2006; pp. 2885-2900; vol. 41, No. 12; IEEE.

Jiang, Yueming et al.; "A Compact Phase Interpolator for 3.125G Serdes Application"; Southwest Symposium on Mixed Signal Design, Feb. 23-25, 2003; pp. 249-252; IEEE.

* cited by examiner

DOUBLE-BALANCED SINUSOIDAL MIXING PHASE INTERPOLATOR CIRCUIT AND METHOD

BACKGROUND

1. Field

This disclosure relates generally to phase interpolator circuits, and more specifically, to a double-balanced sinusoidal mixing phase interpolator circuit and method.

2. Related Art

In high speed serial data communications, clock and data recovery (CDR) must be performed on a noisy input data stream before corresponding data can be further processed by a digital system. Generally, in a digital core based clock recovery system, a reference clock signal of a given frequency can be generated together with a number of different clock signals having the same frequency but with different phases. For example, the different clock signals can be generated by applying the reference clock signal to a delay network. Thereafter, one or more of the clock signals are compared to the phase and frequency of an incoming data stream and one or more of the clock signals are selected for data recovery.

In another implementation, a single interpolator is comprised of N current sources that are selectively turned on or off, in accordance with an applied M bit interpolation control word, to mix two clock signals of fixed phase difference to obtain a desired clock phase. The desired clock can have its synthesized phase falling anywhere discretely between the two fixed input clock phases. The performance of clock recovery circuit highly relies on how fine and how uniform the interpolator can generate the desired clock phase.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
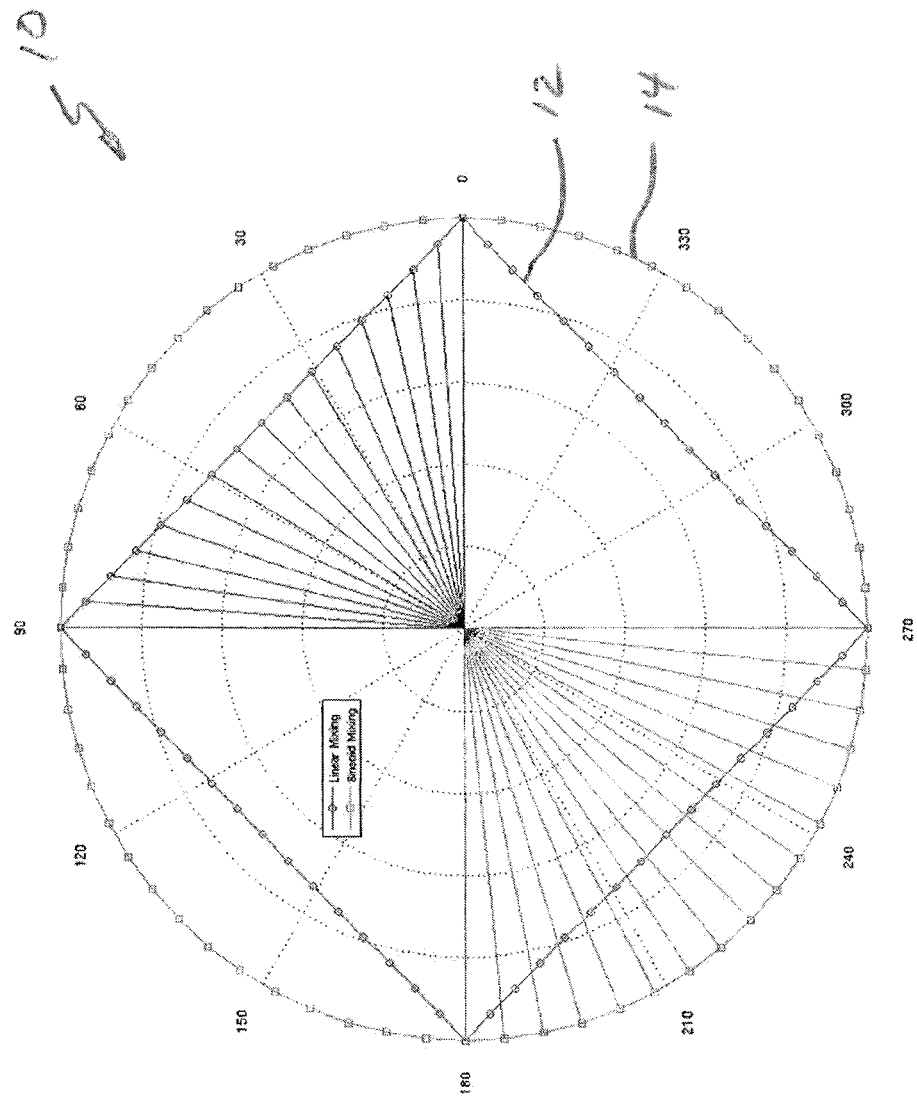
FIG. 1 is a phase constellation diagram view illustrating aspects of linear mixing and sinusoidal mixing in the context of embodiments of the present disclosure.

According to the embodiments of the present disclosure, a phase interpolator (PI) circuit having nearly ideal phase step linearity is provided. For greater understanding, consider that in digital core based clock and data recovery (CDR), the PI takes digital phase control code from a digital core and generates a clock phase shift by mixing two quadrature-spaced clock inputs. The phase shift precision of the PI is very important for CDR performance in high speed I/O and SerDes (Serializer/Deserializer) circuitry. For example, for a 5 Gbps data stream, the data eye opening may be around 100 psec, and to allow optimum sampling of data, the sampling clock edge generated by the PI should be in the center of the data eye. A PI which has extremely linear phase step is very desirable. For example, if PI has 100-step across 2 pi ($2\pi$) or 400 psec, then one (1) step ideally is 4 psec. That 4 psec is the finest step the CDR can use to sample the data eye, and that 4 psec has to be counted in the total mentioned 100 psec timing budget. If the PI has bad phase step linearity, for example, some step may have 10 psec, while some other step may have 1 psec, then the worst step has to be counted in the 100 psec timing budget, which in this case makes the total available setup/hold time 6 psec less for data sampling, and likely will result in data error. The issue is getting worse when data rates increase as smaller timing budget become available. In many designs, where the PI has bad phase linearity or even missing codes are common, especially around quadrant boundaries, phase steps are very small and likely missing, while in the middle of each quadrant, phase steps are too large, which prevents optimum sampling point to be reached and causes timing budget to be undesirably wasted. Accordingly, it would be desirable to design a PI having nearly ideal staircase phase steps. Also for a low voltage design, it would be desirable to not have a clock polarity selection circuit to be stacked with the PI core, as stacking always requires extra voltage supply headroom. For a low power design, it is desirable to remove any clock muxing circuit before the PI core (such as is widely used for clock polarity selection).

The embodiments of the present disclosure include a phase interpolator (PI) configured to perform genuine sinusoidal mixing of input in-phase (I) and quadrature (Q) phased clocks, and embed the quadrant selection within phase control codes, wherein no explicit I and Q clock polarity selection circuit is needed, and thereby providing an advantageous design for low voltage and low power. In one embodiment, current-mode-logic (CML) topology is used for the PI core. I or Q clock weighting is generated by a current-steering DAC (digital-to-analog converter). Larger DAC current for the I or Q clock is handled via corresponding larger weighting for I or Q clock in the mixing. Double-balanced is used to generate nearly one-to-one mapping between DAC current and CML AC gain, wherein the gain comprises the weighting of the I or Q clock.

In popular single-balanced design, circuit limitations prevent simple one-to-one mapping between DAC current and AC gain, as gain to current relationship is not linear fundamentally in the CML circuit topology. Gain is roughly proportional to current with power index of 0.7~0.8 in single-balanced interpolator core. Double-balance makes the index close to 0.9~1. The DAC current cells are thermometer-code controlled, that is, phase control code is unary weighting. However, by customizing each individual current cell inside the DAC by a sinusoidal scale, sinusoidal weighting on I or Q is obtained, while simple linear code is used for phase rotation. As a result, sinusoidal weighting is generated with similar simple linear DAC code as commonly used. The "sinusoidal DAC" (i.e., linear input code, sinusoidal output current) is an important feature which enables the realization of genuine sinusoidal mixing inexpensively.

The sinusoidal DAC is symmetrical from the middle current cells, and is configured to scale down in a sinusoidal manner to each end. For example, for a 32-step DAC, cell 15 and cell 16 (corresponding to middle code cells) are same largest, cell 14 and cell 17 are same second largest, and so on, wherein cell 0 and cell 31 (corresponding to end code cells) are smallest. While input clock I and Q polarity selection is not explicitly needed (i.e., via a distinct polarity selection circuit), with the double-balanced topology of the embodiments of the present disclosure, current I and I_B relative weighting from the left side of the double-balance topology decides clock I's polarity. Similarly, this also applies for clock Q. Accordingly, quadrant selection is embedded within the phase control code.

The embodiments of the present disclosure advantageously resolves the phase linearity problem by creating nearly sinusoidal mixing coefficients for quadrature-spaced input clocks mixing in an inexpensive and efficient way, with negligible impact to a corresponding interface circuit. As described above, sinusoidal mixing is realized by first making DAC current to CML gain nearly proportional, and then making the DAC output sinusoidal current responsive to being fed with a linear control code. In this situation, the phase interpolator follows the mathematical trigonometric relationship: $\sin(\omega t+\phi)=\cos\phi\cdot\sin(\omega t)+\sin\phi\cdot\cos(\omega t)$, wherein the phase steps are intrinsically linear. From the corresponding phasor diagram, an evenly spaced circular phase constellation is generated, instead of the popular diamond phase constellation, which thereby confirms that the sinusoidal mixing works across changes in process, voltage and temperature (PVT). While current known implementations use linear mixing and treat sine and cosine as linear functions, the resultant constellation is rough and generates intrinsically non-linear phase steps. According to the embodiments of the present disclosure, nearly sinusoidal mixing for phase interpolation can be realized, wherein narrower phase steps or missing codes around quadrant boundary, and larger phase steps in the middle of quadrants are advantageously avoided. Nearly stair-case like phase steps can be obtained with the embodiments of the present disclosure. Furthermore, the embodiments of the present disclosure require no explicit clock polarity selection circuit stacked with the PI core and no clock muxing in front of the PI core, wherein the embodiments are advantageously suitable for low voltage and low power applications.

Accordingly, it would be desirable to have a phase interpolator (PI) perform the following mathematical function to set different phase positions across 360° uniformly.

$$\sin(\omega t+\phi)=\cos\phi\cdot\sin(\omega t)+\sin\phi\cdot\cos(\omega t)$$

where $\sin(\omega t)$ is the input clock I and $\cos(\omega t)$ is the input clock Q. For a specific phase position $\phi$, two sinusoidal weighting coefficients $\cos\phi$ and $\sin\phi$ need to be generated from the circuit. However, prior to discovery of the embodiments of the present disclosure, no circuit techniques were known or reported to efficiently generate sinusoidal mixing for quadrature-spaced input clocks for a phase interpolator of digital core based CDR architecture. In one embodiment of the present disclosure, the method and circuit apparatus use double-balance to improve current to gain linearity, and sinusoidal mixing implemented to improve PI intrinsic phase step linearity.

In the context of linear mixing behavior at a phase interpolator output, and when weighting for input I and Q clocks of the phase interpolator are linear, then the phase steps are intrinsically non-linear. For such a prior known phase interpolator, the non-linear phase step variations can be as large as 100% variations, due to Sine and Cosine not being linear functions of phase at all. However, in the context of sinusoidal mixing behavior at the phase interpolator output according to the embodiments of the present disclosure, wherein weighting for input I and Q clocks of the corresponding phase interpolator are sinusoidal, then the phase steps are uniformly spaced and further have no intrinsic non-linearity. The embodiments according to the present disclosure advantageously solve the phase step non-linearity problem encountered in quadrature mixing phase interpolator circuits.

FIG. 1 is a phase constellation diagram view 10 illustrating aspects of linear mixing and sinusoidal mixing in the context of embodiments of the present disclosure. The constellation 12 is representative of a common linear mixing scheme in phase interpolation, which is subject to intrinsic non-linear phase step variations. Constellation 12 results in a diamond phase constellation. The constellation 14 is representative of a sinusoidal mixing scheme for superior phase linearity, according to the embodiments of the present disclosure. Constellation 14 results in a circular phase constellation.

In particular, phase constellation diagram 10 illustrates a fundamental mechanism of how phase positions can be synthesized between two input phasor clocks I and Q. For example, if 0 degree represents clock I and 90 degree represents clock Q, then the interpolated clock will fall between 0 and 90 degrees, with the exact position being decided by the particular weighting coefficients on clock I and clock Q. Since linear coefficients can be easily realized, for example, using a linear DAC, the known art can generate linear mixing between clock I and clock Q as represented by the phase constellation 12. However, the resultant interpolated clock from linear mixing of phasor I and phasor Q disadvantageously possesses non-linear phase step among its neighboring phase positions. For example, at the quadrant boundary, phase steps are crowded; whereas, in the middle of the quadrant, phase steps are widely spaced and can be intrinsically 100% larger than their counterparts at the quadrant boundary. Furthermore, the phase constellation 12 is a diamond shape.

According to one embodiment of the present disclosure, specialized weighting coefficients are applied to phasor clock I and phasor clock Q, wherein the corresponding phase steps among different interpolated clocks are substantially uniform across 360 degrees, as represented by the phase constellation 14. The specialized weighting coefficients comprise sinusoidal coefficients. In addition, the resultant phase steps are evenly distributed everywhere, wherein there is no difference between quadrant boundary and quadrant inner region any more. Furthermore, the phase constellation 14 is a circular shape.

Based upon the above, it has been found that linear mixing causes the fundamental phase step non-linearity problem. As will be discussed further herein, the embodiments of the present disclosure comprise a "Sinusoidal DAC" which can be realized inexpensively and efficiently. With the use of a sinusoidal weighting coefficient circuit, the phase interpolator with intrinsic phase step linearity is advantageously obtained by mixing the input phasor clock I and Q sinusoidally.

Linear mixing and sinusoidal mixing as discussed above are still both related to a quadrature mixing phase interpolator circuit, in which clock I and Q are within a quadrant of phase constellation diagram, for example, within 0 and 90 degrees, or within 90 and 180 degrees. In addition, the phase interpolator circuits may further split one quadrant into several subsections, for example, 0~45 degree and 45~90 degree, wherein linear mixing and sinusoidal mixing schemes can still apply. The double-balanced sinusoidal mixing phase interpolator circuit according to the embodiments of the present disclosure can also be used for a sub-quadrature mixing phase interpolator. When finished with one quadrant of phase interpolating, clock I or clock Q need to change clock polarity to rotate to a next quadrant. Clock polarity selection will be discussed further herein.

Figure 2:
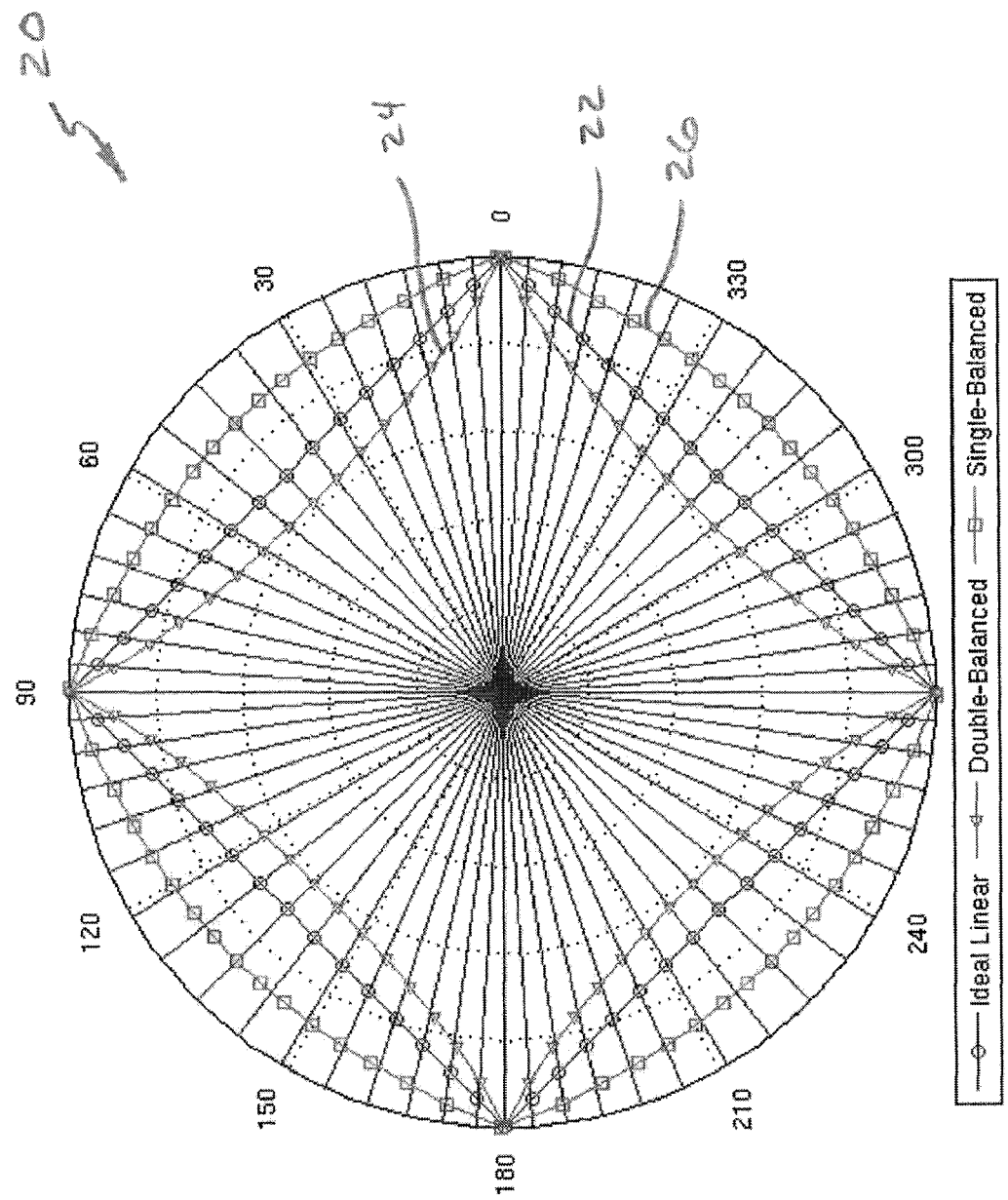
FIG. 2 is a phase constellation view illustrating a linear mixing implementation for single-balanced and double-balanced configurations compared with an ideal case, in conjunction with the embodiments of the present disclosure.

FIG. 2 is a phase constellation view 20 illustrating a linear mixing implementation for single-balanced and double-balanced configurations compared with an ideal case, in conjunction with the embodiments of the present disclosure. Constellation 22 is representative of an ideal behavior of phase constellation from linear mixing. Constellation 24 is representative of a behavior of phase constellation from a double-balanced linear mixing circuit result. It is noted that in constellation 24, the corresponding phase steps are very close to an ideal behavior. Constellation 26 is representative of a behavior of phase constellation from a single-balanced linear mixing circuit result. It is noted that in constellation 26, the phase steps include an undesirable non-linearity, on the order of two times (2×) larger around the quadrant boundaries, and being much smaller in the middle between quadrant boundaries. The reason for the significant degradation of single-balanced linear mixing circuit from ideal behavior of linear mixing is as follows: a linear mixing circuit uses a linear DAC to change weighting coefficients of input clock I or Q, however, when the DAC current is linearly changed, the single-balanced interpolator core will have gain on clock I or Q changed, but not linearly at all, due to CML circuit topology having no proportional mapping between tail current and output to input gain. Gain here is simply the mixing coefficient of clock I or Q. However, the double balanced circuit topology of the present embodiments advantageously improves DAC current to CML gain proportional mapping, and as observed from phase constellation diagram, it provides close to ideal behavior.

According to one embodiment of the present disclosure, the method includes making CML gain, which corresponds to the weighting coefficient of input clock I or Q, proportional to DAC current, wherein the DAC comprises a sinusoidal DAC. In one embodiment, the sinusoidal DAC outputs a sinusoidal current in response to receiving a linear digital code as an input.

In particular, constellation view 20 comprises three (3) phase constellation diagrams overlaid together for comparison: 1) linear mixing from ideal circuit behavior, as indicated by reference numeral 22, 2) double-balanced interpolator core based on a CML circuit topology, as indicated by reference numeral 24, 3) single-balanced interpolator core based on a CML circuit topology, as indicated by reference numeral 26. For constellation 22, the ideal circuit assumes DAC current has perfect proportional mapping to CML gain, so when DAC current changes linearly, CML gain will also changes 100% linearly. CML gain is the clock I or Q weighting coefficient, so the mixing is perfect linear mixing. For constellation 24, the double-balanced circuit topology for interpolator core has nearly ideal proportional mapping from DAC current to CML gain, so the phase constellation and phase step pattern are very close to the ideal circuit behavior case. For constellation 26, the single-balanced circuit topology for interpolator core has significant degradation from ideal proportional mapping between DAC current and CML gain, so the phase constellation and phase step pattern are noticeably different from the ideal circuit behavior case, and phase step linearity of single-balanced circuit topology is very non-uniform, as much as 2× difference between quadrant boundary and quadrant inner region can be observed. Since CML circuit topology is valid and popular for high speed circuit design, the double-balance interpolator core circuitry has been discovered to effectively solve the DAC current and CML gain linearity degradation to overcome the problems of the single-balanced interpolator core circuit.

Figure 3:
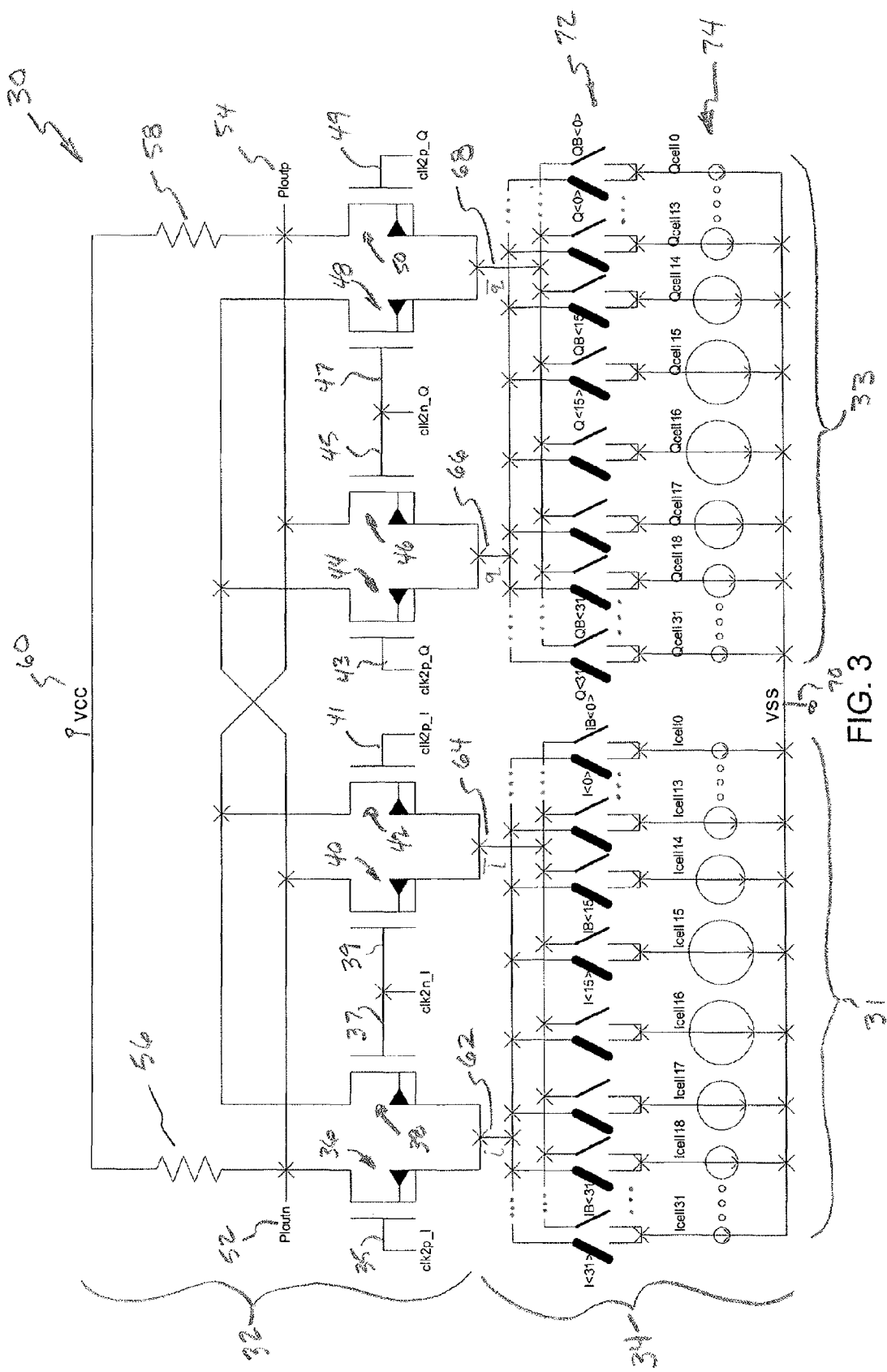
FIG. 3 is a schematic block diagram view of a double-balanced sinusoidal mixing phase interpolator according to one embodiment of the present disclosure.

FIG. 3 is a schematic block diagram view of a double-balanced sinusoidal mixing phase interpolator 30 according to one embodiment of the present disclosure. Phase interpolator 30 includes a double-balanced portion 32 and a sinusoidal DAC portion 34, as will be discussed further herein below. In addition, the phase interpolator 30 is further characterized as including a sinusoidal DAC for differential input clock I, generally represented by reference numeral 31, and a sinusoidal DAC for differential input clock Q, generally indicated by reference numeral 33. As will be discussed further herein, responsive to phase control code for clock I, sinusoidal DAC 31 is configured to generate a corresponding current for an updated weighting coefficient for clock I, prior to the phase interpolator performing clock I and clock Q mixing. Furthermore, responsive to phase control code for clock Q, sinusoidal DAC 33 is configured to generate a corresponding current for an updated weighting coefficient for clock Q, prior to the phase interpolator performing clock I and clock Q mixing. Still further, responsive to a corresponding DAC input (i.e., simple phase control code) sweeping in linear steps for DAC 31 and DAC 33, the respective DAC output (i.e., complementary current I and I_B for DAC 31 and complementary current Q and Q_B for DAC 33) correspondingly changes in sinusoidal steps. Sinusoidal DAC portion 34 includes a ground node (Vss) 70, bit-by-bit complementary current steering switches for DAC 31 (DACI) and DAC 33 (DACQ) generally indicated by reference numeral 72, and sinusoidally scaled current cells for DAC 31 and DAC 33 generally indicated by reference numeral 74. Double-balanced interpolator core portion 32 will be discussed further herein below with reference to FIG. 4. The sinusoidal DAC portion 34 will be discussed further herein below with reference to FIG. 5.

Figure 4:
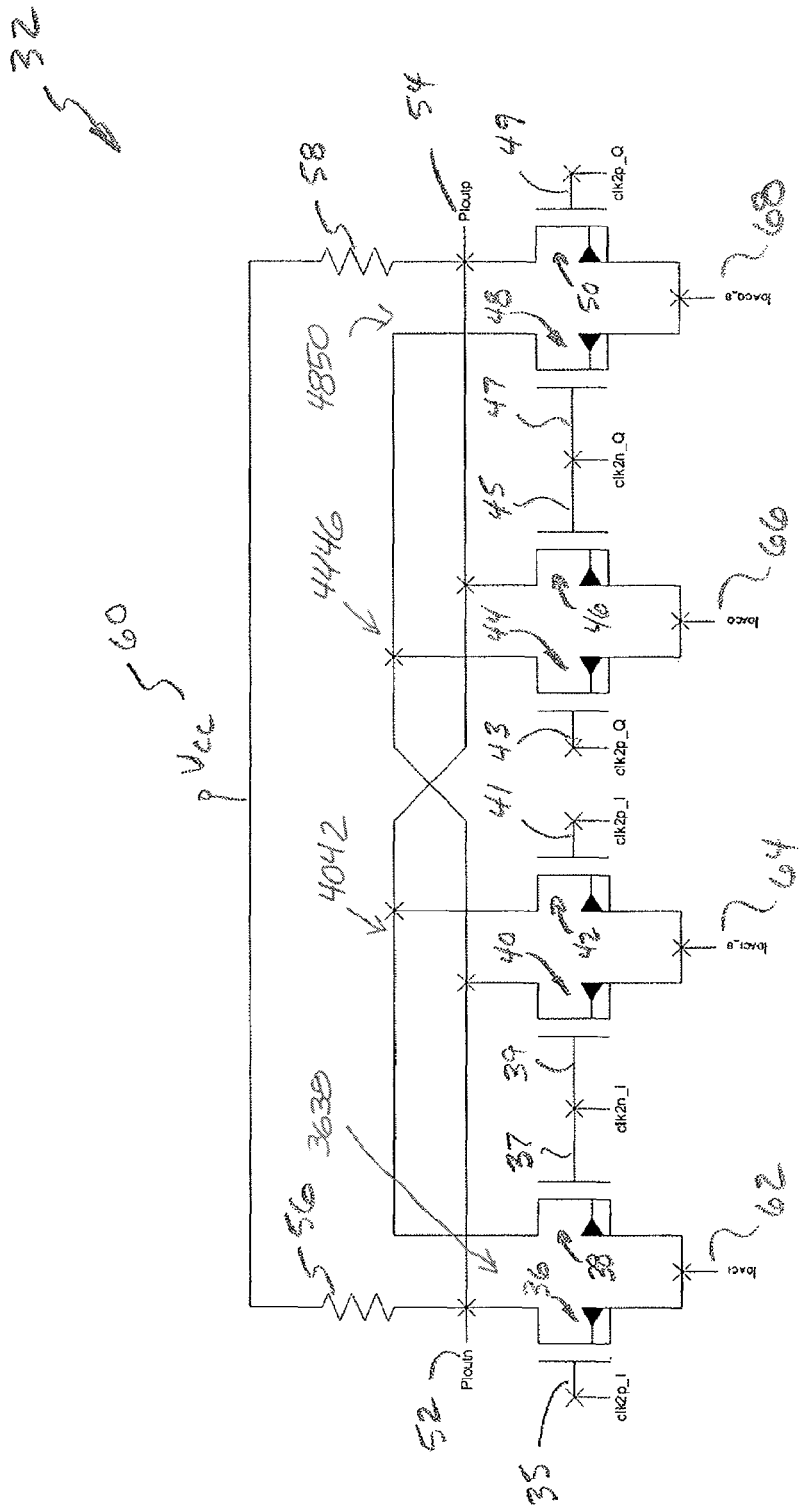
FIG. 4 is a schematic block diagram view of the double-balanced portion of the phase interpolator of FIG. 3 in enlarged detail.

FIG. 4 is a schematic block diagram view of the double-balanced portion 32 of the phase interpolator 30 of FIG. 3 in enlarged detail. Double-balanced interpolator core portion 32 is implemented in CML circuit topology. In one embodiment, double-balanced interpolator core portion 32 includes four (4) differential pairs, as compared with two (2) differential pairs used in a single-balanced implementation. Accordingly, double-balanced interpolator core portion 32 has the benefit of greatly improving DAC current to output gain proportional mapping. Two differential pairs are cross coupled to form a corresponding gain stage for input clock I (transistors 36,38, 40,42) or Q (transistors 44,46,48,50), wherein the gain stage for input clock I and the gain stage for input clock Q are then summed together to form the double-balanced interpolator core to mix input clock I and Q.

The four (4) differential pairs of double-balanced portion 32 comprise transistor pairs 3638, 4042, 4446, and 4850. The first and second differential pairs (3638, 4042) are configured to operate with respect to differential input clock I. The third and fourth differential pairs (4446, 4850) are configured to operate with respect to differential input clock Q.

The first differential pair 3638 includes NMOS transistors 36 and 38. NMOS transistor 36 forms the positive input side of the differential pair and NMOS transistor 38 forms the negative input side of the differential pair. The positive signal of the differential input clock I (clk2p_I) couples to the positive input node 35 of the first differential pair, corresponding to the gate terminal of NMOS transistor 36. In addition, the negative signal of the differential input clock I (clk2n_I) couples to the negative input node 37 of the first differential pair, corresponding to the gate terminal of NMOS transistor 38.

The second differential pair 4042 includes NMOS transistors 40 and 42. NMOS transistor 40 forms the positive input side of the differential pair and NMOS transistor 42 forms the negative input side of the differential pair. The negative signal of the differential input clock I (clk2n_I) couples to the positive input node 39 of the second differential pair, corresponding to the gate terminal of NMOS transistor 40. In addition, the positive signal of the differential input clock I (clk2p_I) couples to the negative input node 41 of the second differential pair, corresponding to the gate terminal of NMOS transistor 42.

The third differential pair 4446 includes NMOS transistors 44 and 46. NMOS transistor 44 forms the positive input side of the differential pair and NMOS transistor 46 forms the negative input side of the differential pair. The positive signal of the differential input clock Q (clk2p_Q) couples to the positive input node 43 of the third differential pair, corresponding to the gate terminal of NMOS transistor 44. In addition, the negative signal of the differential input clock Q (clk2n_Q) couples to the negative input node 45 of the third differential pair, corresponding to the gate terminal of NMOS transistor 46.

The fourth differential pair 4850 includes NMOS transistors 48 and 50. NMOS transistor 48 forms the positive input side of the differential pair and NMOS transistor 50 forms the negative input side of the differential pair. The negative signal of the differential input clock Q (clk2n_Q) couples to the positive input node 47 of the fourth differential pair, corresponding to the gate terminal of NMOS transistor 48. In addition, the positive signal of the differential input clock Q (clk2p_Q) couples to the negative input node 49 of the fourth differential pair, corresponding to the gate terminal of NMOS transistor 50.

Referring still to FIG. 4, node 52 represents the phase interpolator negative output node (Ploutn) and node 54 represents the phase interpolator positive output node (Ploutp). A negative side load resistor 56 is coupled between the supply voltage node 60 (Vcc) and the phase interpolator negative output node 52. Similarly, a positive side load resistor 58 is coupled between the supply voltage node 60 (Vcc) and the phase interpolator positive output node 54. Negative output node 52 also couples to the source/drain terminals of NMOS transistors 36, 40, 44 and 48 of the positive input sides of the corresponding differential pairs. In a similar manner, positive output node 54 couples to the source/drain terminals of NMOS transistors 38, 42, 46 and 50 of the negative input sides of the corresponding differential pairs.

Furthermore, the source/drain terminals of transistors 36 and 38 of the first differential pair 3638 which are not coupled to negative output node 52 or positive output node 54, respectively, are instead coupled together to form the positive side of differential DAC current for differential input clock I ($I_{DACI}$), as indicated by reference numeral 62. The source/drain terminals of transistors 40 and 42 of the second differential pair 4042 which are not coupled to negative output node 52 or positive output node 54, respectively, are instead coupled together to form the negative side of differential DAC current for differential input clock I ($I_{DACI\_B}$), as indicated by reference numeral 64.

Still further, the source/drain terminals of transistors 44 and 46 of the third differential pair 4446 which are not coupled to negative output node 52 or positive output node 54, respectively, are instead coupled together to form the positive side of differential DAC current for differential input clock Q ($I_{DACQ}$), as indicated by reference numeral 66. The source/drain terminals of transistors 48 and 50 of the fourth differential pair 4850 which are not coupled to negative output node 52 or positive output node 54, respectively, are instead coupled together to form the negative side of differential DAC current for differential input clock Q ($I_{DACQ\_B}$), as indicated by reference numeral 68.

Double-balance, in connection with the double-balance portion 32, advantageously provides a good remedy for the non-linearity relationship between DAC current and current mode logic (CML) differential pair gain. With the use of double-balance, the embodiments of the present disclosure establish approximately that gain is proportional to DAC current. Accordingly, double-balance improves current to gain linearity in the phase interpolator design according to the embodiments of the present disclosure. Double-balanced gain (i.e. Gain(double-balanced)) is given by the following expression:

$$\text{Gain}_{Double\text{-}Balanced} = \text{func}(I_{DAC}, I_{DAC\_B}) \propto (I_{DAC} - I_{DAC\_B})^Y Y \approx 0.9 \sim 1.0$$

In comparison, for a single-balanced mixer core such as commonly used in known phase interpolators, when CML $R_{load}$ is not very large, the AC gain of the CML stage is a function of tail current (supplied by an I or Q DAC); however, the single-balanced gain is not a linear function. In other words, single-balanced gain (i.e., Gain(single-balanced)) is given by the following expression:

$$\text{Gain}_{SB} = \text{func}(I_{DAC}) \propto I_{DAC}^X X \approx 0.7 \sim 0.8$$

Figure 5:
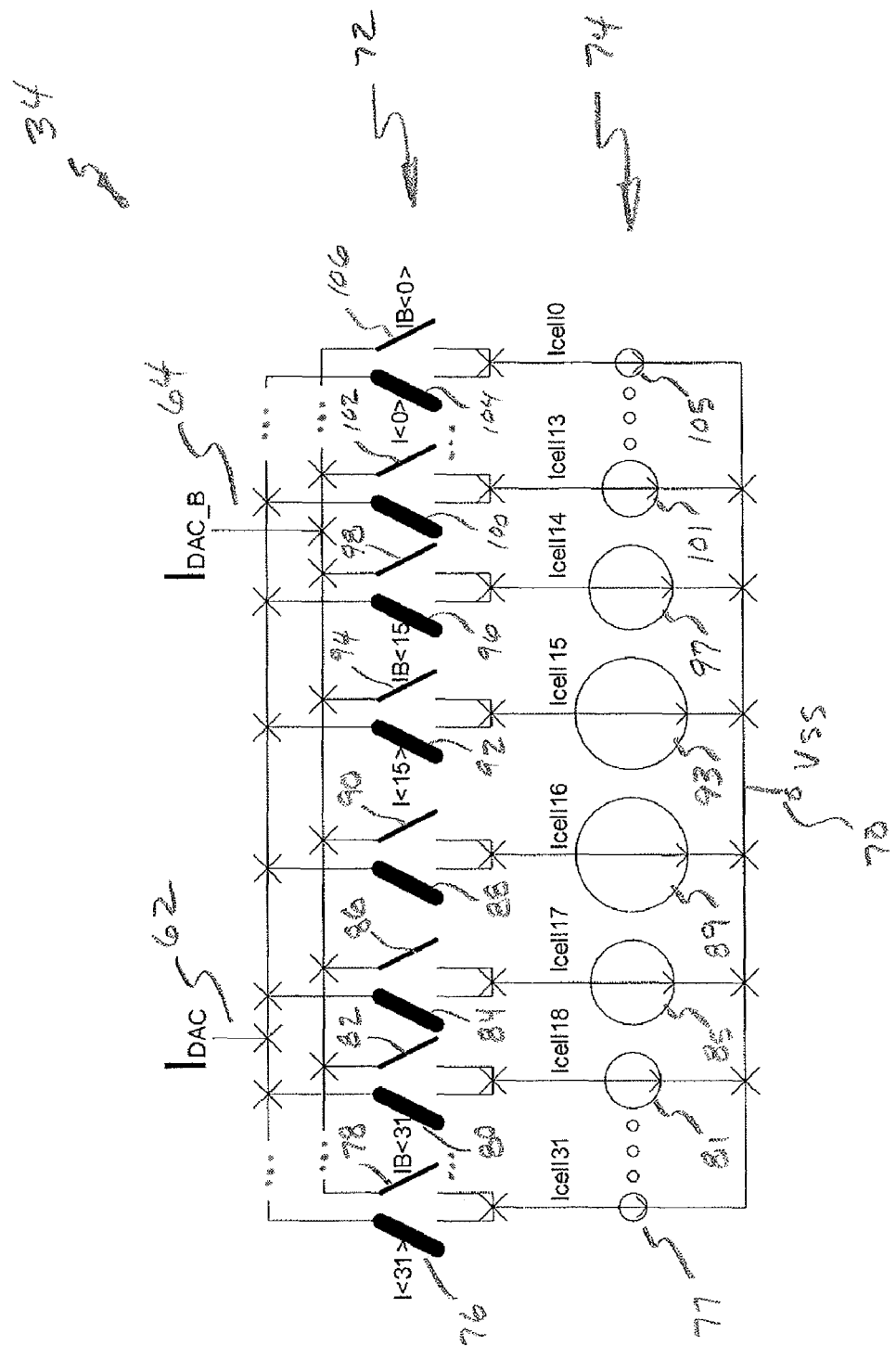
FIG. 5 is a schematic block diagram view of one-half of the sinusoidal DAC portion of the phase interpolator of FIG. 3 in enlarged detail.

FIG. 5 is a schematic block diagram view of one-half of the sinusoidal DAC portion 34 of the phase interpolator 30 of FIG. 3 in enlarged detail. While sinusoidal DAC portion 34 for the phase interpolator circuit comprises two sinusoidal DACs, only one is illustrated in FIG. 5. In particular, FIG. 5 illustrates that portion of the sinusoidal DAC portion configured to operate with respect to differential DAC current for input clock I (i.e., $I_{DAC}$ (62) and $I_{DAC\_B}$ (64)). Note that the following description is also applicable to that portion of the sinusoidal DAC portion configured to operate with respect to differential DAC current for input clock Q (i.e., $Q_{DAC}$ (66) and $Q_{DAC\_B}$ (68)); however, which will not be repeated herein for simplicity. In addition, sinusoidal DAC portion 34 includes a ground node (Vss) 70, bit-by-bit complementary current steering switches for DAC 31 (DACI) and DAC 33 (DACQ) (shown in FIG. 3) generally indicated by reference numeral 72, and sinusoidally scaled current cells for DAC 31 and DAC 33 (shown in FIG. 3) generally indicated by reference numeral 74.

The bit-by-bit complementary current steering switches 72 include a plurality of switches such as indicated by reference numerals 76, 78, . . . , 80, 82, 84, 86, 88, 90, 92, 94, 96, 98, 100, 102, . . . , 104, and 106 for DAC 31 (DACI) in FIG. 5. Switch 76 comprises a positive current steering switch I<31> for bit<31>. In operation, if I<31> input is logic high, Icell31 cell current will be steered to the positive side 62 of the differential DAC, corresponding to $I_{DAC}$ in FIG. 5. Switch 78 comprises a negative current steering switch IB<31> for bit<31>. In operation, if IB<31> input is logic high, Icell31 cell current will be steered to the negative side 64 of differential DAC, corresponding to $I_{DAC\_B}$ in the FIG. 5. Note that switch elements 76 and 78 (I<31> and IB<31>, respectively) are always complementary (i.e., of complementary states) during normal operation, that is, one is logic high, while the other is logic low, or vise versa. In other words, switch elements 76 and 78 are configured such that they will not be both ON and will not be both OFF.

In addition, switch 80 comprises a positive steering switch I<18> for bit<18>. In operation, if I<18> input is logic high, Icell18 cell current will be steered to the positive side 62 of the differential DAC, corresponding to $I_{DAC}$ in FIG. 5. Switch 82 comprises a negative current steering switch IB<18> for bit<18>. In operation, if IB<18> input is logic high, Icell18 cell current will be steered to the negative side 64 of differential DAC, corresponding to $I_{DAC\_B}$ in the FIG. 5. Note that switch elements 80 and 82 (I<18> and IB<18>, respectively) are always complementary. Switch 84 comprises a positive steering switch I<17> for bit<17>. In operation, if I<17> input is logic high, Icell17 cell current will be steered to the positive side 62 of the differential DAC. In addition, switch 86 comprises a negative current steering switch IB<17> for bit<17>, if IB<17> input is logic high, Icell17 cell current will be steered to the negative side 64 of differential DAC. Note that switch elements 84 and 86 (I<17> and IB<17>, respectively) are always complementary. Switch 88 comprises a positive steering switch I<16> for bit<16>. In operation, if I<16> input is logic high, Icell16 cell current will be steered to the positive side 62 of the differential DAC. In addition, switch 90 comprises a negative current steering switch IB<16> for bit<16>, if IB<16> input is logic high, Icell16 cell current will be steered to the negative side 64 of differential DAC. Note that switch elements 88 and 90 (I<16> and IB<16>, respectively) are always complementary.

In a similar manner, switches 92, 96, 100, . . . , 104 comprise positive steering switches (I<15>, I<14>, I<13>, . . . and I<0>, respectively). Each of the positive steering switches are configured to operate in response to a logic high input for steering a corresponding Icell15, Icell14, Icell13, . . . , Icell0 cell current to the positive side 62 of the differential DAC. Switches 94, 98, 102, . . . , 106 comprise negative steering switches (IB<15>, IB<14>, IB<13>, . . . and IB<0>, respectively). Each of the negative steering switches are configured to operate in response to a logic high input for steering a corresponding Icell15, Icell14, Icell13, . . . , Icell0 cell current to the negative side 64 of the differential DAC. Furthermore, the positive steering switch and corresponding negative steering switch for a given current cell are always complementary.

A similar plurality of switches is provided for DAC 33 (DACQ) of FIG. 3. The similar plurality of switches are illustrated in FIG. 3 but only briefly discussed herein. The switches are similar to those illustrated and described herein with reference to those of FIG. 5, with the exception that the positive steering switches and the negative steering switches are for the positive side 66 and the negative side 68 current controls of DAC 33 (DACQ), respectively.

With reference still to FIG. 5, individual DAC cells (indicated by reference numerals 77, . . . , 81, 85, 89, 93, 97, 101, . . . and 105) are sinusoidally scaled. In one embodiment, the DAC comprises a 32-step DAC, wherein Icell15 and Icell16, denoted by reference numerals 93 and 89, respectively, are highest current, sinusoidally scaled to each end (Icell 0 (105) and Icell 31 (77)) respectively, whereby Icell 0 and Icell 31 are smallest current.

In other words, in one embodiment, the DAC 31 comprises a 32-step DAC, wherein the DAC current cells Icell0 (105) to Icell31 (77) are configured for sinusoidal scaling to provide corresponding relative scaling strengths. The scaling is symmetrical from the center current cells (Icell15 (93), Icell16 (89)) to both end current cells. Accordingly, Icell0 and Icell31 are smallest currents, and Icell15 and Icell16 are highest currents. End current cells have bigger current difference, whereas the center current cells have smaller current difference. More particularly, the current cells are scaled by sinusoidal steps, for example, Icell0=Icell31=I*[cos(0*pi/32)-cos(1*pi/32)], Icell1=Icell30=I*[cos(1*pi/32)-cos(2*pi/32)], Icell2=Icell29=I*[cos(2*pi/32)-cos(3*pi/32)], . . . , Icell15=Icell16=I*[cos(15*pi/32)-cos(16*pi/32)]. In a similar manner, the DAC can be configured for any other size step DAC according to the requirements of a given phase interpolator implementation (e.g., 64-step, 128-step, or other, etc.).

With reference still to FIG. 5., the plurality of sinusoidally scaled current cells 74 for DACI include current cells <31> through <0>, wherein some current cells are represented by the series of dots ". . . " between the current cells <31> and <18> and between <13> and <0>. For example, DAC current cell <31> is indicated by reference numeral 77, wherein its relative strength is equal to a quantity given by the expression I*[cos(0*pi/32)-cos(1*pi/32)], where I is some constant. In a similar manner, DAC current cell <18> is indicated by reference numeral 81, wherein its relative strength is equal to a quantity given by the expression I*[cos(13*pi/32)-cos(14*pi/32)], where I is some constant. DAC current cell <17> is indicated by reference numeral 85, wherein its relative strength is equal to a quantity given by the expression I*[cos(14*pi/32)-cos(15*pi/32)], where I is some constant. DAC current cell <16> is indicated by reference numeral 89, wherein its relative strength is equal to a quantity given by the expression I*[cos(15*pi/32)-cos(16*pi/32)], where I is some constant. DAC current cell <15> is indicated by reference numeral 93, wherein its relative strength is equal to a quantity given by the expression I*[cos(15*pi/32)-cos(16*pi/32)], where I is some constant. DAC current cell <14> is indicated by reference numeral 97, wherein its relative strength is equal to a quantity given by the expression I*[cos(14*pi/32)-cos(15*pi/32)], where I is some constant. DAC current cell <13> is indicated by reference numeral 101, wherein its relative strength is equal to a quantity given by the expression I*[cos(13*pi/32)-cos(14*pi/32)], where I is some constant. DAC current cell <0> is indicated by reference numeral 105, wherein its relative strength is equal to a quantity given by the expression I*[cos(0*pi/32)-cos(1*pi/32)], where I is some constant.

A similar plurality of sinusoidally scaled current cells 74 for DACQ include current cells <31> through <0>, wherein some current cells are represented by the series of dots ". . . " between the current cells <31> and <18> and between <13> and <0>. The similar plurality of sinusoidally scaled current cells 74 for DACQ are illustrated in FIG. 3 but only briefly discussed herein. The sinusoidally scaled current cells are similar to those illustrated and described herein with reference to the plurality of sinusoidally scaled current cells 74 of FIG. 5.

Figure 6:
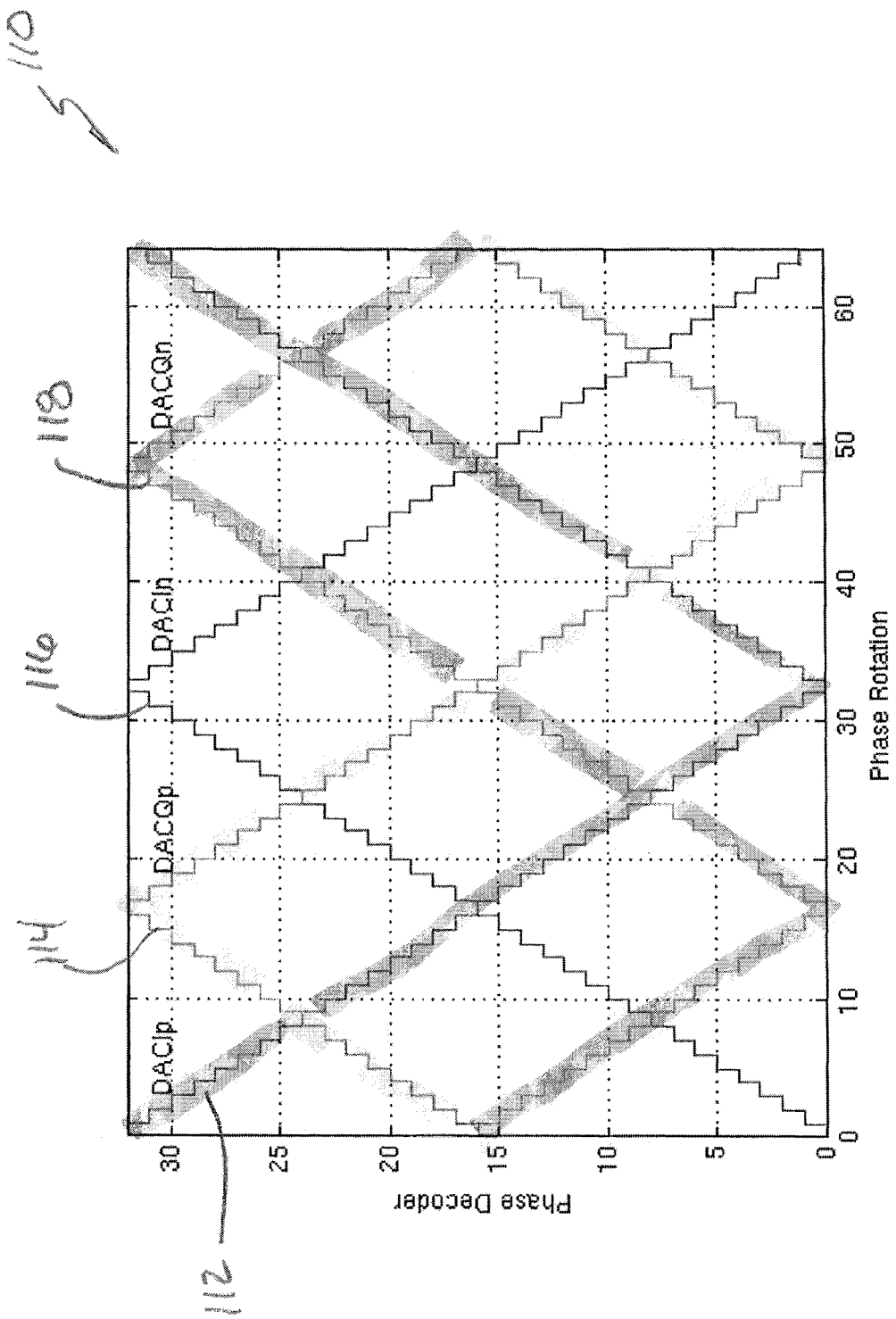
FIG. 6 is a plot of phase decoder control code versus phase rotation for DAC current Ip, Qp, In, and Qn of the phase interpolator according to the embodiments of the present disclosure.

FIG. 6 is a plot 110 of phase decoder control code versus phase rotation for the phase interpolator according to one embodiment of the present disclosure. Phase decoder control code value is presented on the vertical axis, with a scale from zero (0) to thirty-two (32). Phase rotation value (i.e., phase position) is presented on the horizontal axis along 360 degrees (i.e., one (1) full phase rotation), with a scale from zero (0) to sixty-four (64) for a 64-step design implementation. DAC control codes DACIp, DACQp, DACIn, and DACQn of the phase interpolator decide the specific phase position along the total 360 degree rotation, and as control codes progress, the corresponding phase position progresses from position 0 (0 degree) to position 64 (360 degree) for the 64-step interpolation design case according to one embodiment of the present disclosure. When phase shift goes larger than 360 degrees, it will be mod-divided by 360 and the corresponding new phase still fits within the range of 0 to 360 degrees, as if it has been rotated back.

Phase decoder versus phase rotation for DAC current Ip control (digital code DACIp) is indicated by reference numeral 112. Phase decoder versus phase rotation for DAC current Qp control (digital code DACQp) is indicated by reference numeral 114. Phase decoder versus phase rotation for DAC current In control (digital code DACIn) is indicated by reference numeral 116. Phase decoder versus phase rotation for DAC current Qn control (digital code DACQn) is indicated by reference numeral 118. In particular, the DAC control code is linear in total weight and thermometer coded. For example, for a phase decoder value DACIp=10, (correspondingly DACIn=22, DACQp=26, DACQn=6 and phase rotation position=position 22), the corresponding DAC current Ip digital control code I<31:0>=00 . . . 011 . . . 1 (i.e., 22 zeros and 10 ones). Furthermore, DACIn is DACI p's two's complement (i.e., 2's complement). In addition, DACQn is DACQp's two's complement (i.e., 2's complement).

In other words, reference numeral 112 identifies control code DACIp versus phase positions along 360 degrees. In one embodiment, the numerical value is the control code DACIp's weight, which is thermometer-coded as a 32-bit code and configured to control the DACI 31 positive side 62 (see FIG. 3) as I<31:0>. For example, if DACIp=10, then the control weight of the positive clock I is 10. The control weight for the value 10 can be coded as I<31:0>=00 . . . 011 . . . 1 (i.e., 22 zeros and 10 ones).

Reference numeral 114 identifies control code DACQp versus phase positions along 360 degrees. The numerical value is the control code DACQp's weight, which is thermometer-coded as a 32-bit code and configured to control the DACQ 33 positive side 66 (see FIG. 3) as Q<31:0>. For example, if DACQp=26, then the control weight of the positive clock Q is 26. The control weight for the value 26 can be coded as Q<31:0>=00 . . . 011 . . . 1 (i.e., 6 zeros and 26 ones).

Reference numeral 116 identifies control code DACIn versus phase positions along 360 degrees. The numerical value is given by thirty-two minus the control code DACIp (i.e., the numerical value=32-DACIp) and the corresponding 32-bit code IB<31:0> comprises the complement of code I<31:0> bit by bit. The control code IB<31:0> is configured to control DACI 31 negative side 64 (see FIG. 3). For example, if DACIp=10, then DACIn=22, whereby the control weight of the negative clock I is 22. The control weight for the value 22 can be coded as IB<31:0>=11 . . . 100 . . . 0 (i.e., 22 ones and 10 zeros), Reference numeral 118 identifies control code DACQn versus phase positions along 360 degree. The numerical value is given by thirty-two minus the control code DACQp (i.e., the numerical value=32-DACQp) and the corresponding 32-bit code QB<31:0> comprises the complement of code Q<31:0> bit by bit. The control code QB<31:0> is configured to control DACQ 33 negative side 68 (see FIG. 3). For example, if DACQp=26, then DACQn=6, whereby the control weight of the negative clock Q is 6. The control weight for value 6 can be coded as QB<31:0>=11 . . . 100 . . . 0 (i.e., 6 ones and 26 zeros), Furthermore, from the plot 110, it should be noted that the phase control codes continuously cross four (4) phase quadrants (for a 64-step interpolation design case: quadrant 1: position 0~15; quadrant 2: position 16~31; quadrant 3: position 32~47, quadrant 4: position 48~63) as the control codes progress through the phase rotation positions from 0 to 64 (i.e., corresponding to at total of 360 degrees), and thus no explicit clock polarity selection circuit is needed. The relative numerical weights of DACIp and DACIn codes decide which polarity of input clock I will be used to perform the mixing. If DACIp numerical weight is larger than that of DCAIn, positive clock I polarity is used; otherwise, negative clock I polarity is used. The same procedure applies for DACQp, DACQn numerical weights and input clock Q polarity. Accordingly, this advantageously provides for enabling a low voltage and low power implementation of phase interpolator according to the embodiments of the present disclosure.

Figure 7:
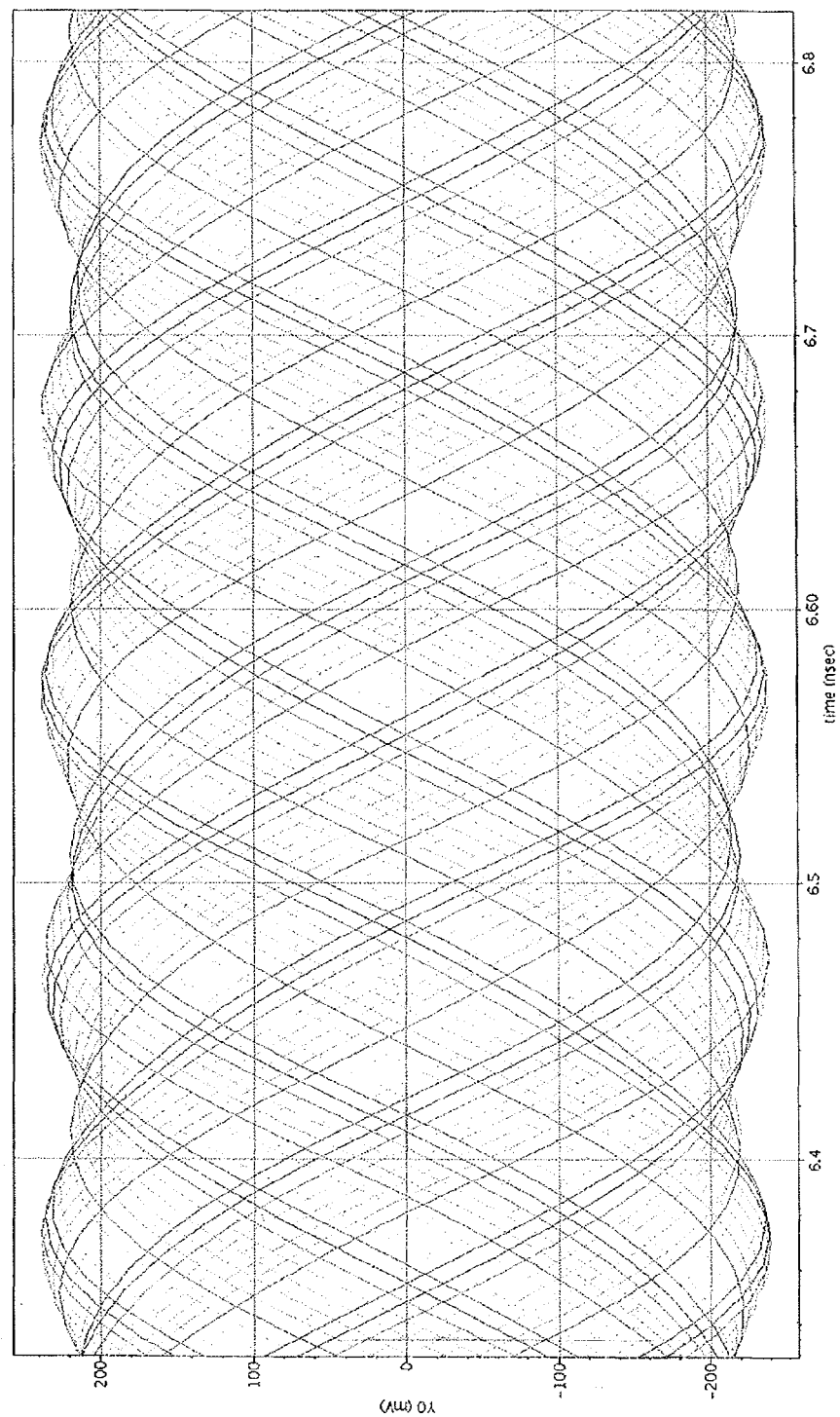
FIG. 7 is an overlay plot of synthesized clock waveforms YO(mV) versus time (nsec) to show the uniform phase step shift for a phase interpolator according to one embodiment of the present disclosure.

FIG. 7 is an overlay plot 120 of synthesized clock waveforms YO(mV) versus time (nsec) to show the uniform phase step shift for a phase interpolator (corresponding to a 64-step interpolation design case) according to one the embodiment of the present disclosure. In particular, plot 120 represents a total of sixty-four (64) 2.5 GHz clocks (YO(mv)), each being 6.25 psec phase-spaced overlaid on the time scale, corresponding to the horizontal axis, to illustrate the uniform phase step linearity for the phase interpolator. In addition, the overlay plot 120 represents a 64 clocks phase-shifted clocks overlay for one (1) PVT corner, not across PVT's. From the plot, one can observe that the linear phase steps uniformity across the total 360 degrees (64-steps). There is no phase crowding behavior around quadrant boundaries or widely-spaced phase steps in the middle of quadrants, as commonly encountered in prior known linear mixing cases. Also, no explicit clock polarity selection circuit was needed, as the digital phase control codes for the phase interpolator are configured continuously and uniquely across 360 degrees and control explicitly across 360 degree.

The embodiments of the present disclosure thus advantageously provide superior intrinsic phase step linearity. Across all four quadrants, step errors are on the order of less than 0.25 LSB, and accumulative error on the order of less than 0.75 LSB across PVT simulations. The embodiments provide no missing codes or phase crowding behaviors around quadrant boundaries. The embodiments further provide a nearly circular phase constellation in phasor diagram across PVT simulations. Furthermore, no explicit clock polarity selection circuit is needed by the embodiments of the present disclosure. Still further, the embodiments of the present disclosure are well suited for low voltage and low power, for example, using a 0.9 V supply and 1.5 mA per interpolator path.

The phase interpolator according to the embodiments of the present disclosure, advantageously performs nearly ideal sinusoid mixing of input in-phase and quadrature-phase clocks, and embeds the quadrant selection within phase control codes, wherein no explicit I and Q clock polarity selection circuit are needed, further for low voltage and low power. The sinusoidal mixing is realized by using a double-balanced circuit topology to improve current to ac gain linearity and customizing DAC current cells by sinusoidal scale so sinusoidal weightings on I and Q are achieved from simple linear phase code inputs. This way, intrinsic linear phase steps are realized. On a phasor diagram, an evenly phase-spaced circular phase constellation is provided, instead of the known diamond phase constellation.

By now it should be appreciated that there has been provided a double-balanced sinusoidal mixing phase interpolator comprising: a double-balanced gain stage having a first input for receiving a first phasor clock, a second input for receiving a second phasor clock, and a phase interpolator (PI) output, wherein the double-balance gain stage includes (i) a first gain stage having a positive input side and a negative input side for the first phasor clock and (ii) a second gain stage having a positive input side and a negative input side for the second phasor clock; and a sinusoidal digital-to-analog (DAC) stage coupled to the double-balanced gain stage and configured to implement sinusoidal weighting of positive and negative sides of differential DAC current for the first phasor clock and positive and negative sides of differential DAC current for the second phasor clock, wherein the sinusoidal weighting provides uniformly spaced phase steps in the phase interpolator (PI) output.

In another embodiment, the sinusoidal weighting further provides for intrinsic phase step linearity in the phase interpolator (PI) output across 360 degrees. In addition, the double-balanced gain stage is configured to render a current mode logic (CML) gain of the first and second phasor clock inputs nearly proportional to a current from the sinusoidal DAC stage. In a further embodiment, the first gain stage is configured to provide (i)(a) a positive side of differential DAC current and (i)(b) a negative side of differential DAC current for the first phasor clock, and wherein the second gain stage is configured to provide (ii)(a) a positive side of differential DAC current and (ii)(b) a negative side of differential DAC current for the second phasor clock.

In yet another embodiment, the phase interpolator output comprises (i) a positive output node (Ploutp) coupled to transistors on the positive input sides of the first and second gain stages and (ii) a negative output node (Ploutn) coupled to transistors on the negative input sides of the first and second second gain stage.

In a still further embodiment, the first input includes a positive input node clk2p_I and a negative input node clk2n_I and wherein the second input includes a positive input node clk2p_Q and a negative input node clk2n_Q. The first gain stage includes first and second cross-coupled differential transistor pairs, wherein (i) the positive input node clk2p_I couples to a positive input side of the first differential transistor pair and couples to a negative input side of the second differential transistor pair, and (ii) the negative input node clk2n_I couples to the negative input side of the first differential transistor pair and couples to the positive input side of the second differential transistor pair. The second gain stage includes third and fourth cross-coupled differential transistor pairs, wherein (i) the positive input node clk2p_Q couples to a positive input side of the third differential transistor pair and couples to a negative input side of the fourth differential transistor pair, and (ii) the negative input node clk2n_Q couples to the negative input side of the third differential transistor pair and couples to the positive input side of the fourth differential transistor pair. Still further, a tail current of the first differential transistor pair comprises the positive side of differential DAC current for the first phasor clock, a tail current of the second differential transistor pair comprises the negative side of the differential DAC current for the first phasor clock, a tail current of the third differential transistor pair comprises the positive side of the differential DAC current for the second phasor clock, and a tail current of the fourth differential transistor pair comprises the negative side of the differential DAC current for the second phasor clock.

In a still further embodiment, the first and second gain stages are coupled together for mixing the sinusoidally weighted first and second phasor clock inputs. In another embodiment, the sinusoidal DAC stage includes (i) a first DAC with bit-by-bit complementary current steering switches configured to sinusoidally weight the positive and negative sides of the differential DAC current for the first phasor clock and (ii) a second DAC with bit-by-bit complementary current steering switches configured to sinusoidally weight the positive and negative sides of the differential DAC current for the second phasor clock. In yet another embodiment, the bit-by-bit complementary current steering switches of the first and second DAC are responsive to digital phase control code for rendering the positive and negative sides of the corresponding differential DAC current sinusoidal.

In a still further embodiment, each of the first and second DACs include a plurality of current cells, wherein the plurality of DAC current cells are sinusoidal weighted for providing a sinusoidal current in response to linear digital phase control code, and wherein the first and second DACs each comprises a plurality of complementary current steering switches and a plurality of sinusoidally weighted current cells, wherein the sinusoidal weighting is symmetrical about current cells within the middle of the plurality of current cells, the sinusoidal weighting further including scaling from the middle of the plurality of current cells in a sinusoidal manner to each end of the plurality of cells. In another embodiment, the digital phase control code comprises linear code configured to implement phase rotation. The linear code can comprise thermometer-code with unary weighting.

In another embodiment, the digital phase control code intrinsically includes clock polarity selection for the phase interpolator (PI) output. In addition, a first current-steering digital-to-analog converter (DAC) is configured to provide in-phase (I) clock weighting, and a second current-steering digital-to-analog converter (DAC) is configured to provide quadrature (Q) clock weighting. Furthermore, the double-balanced gain stage implements sinusoidal mixing of input in-phase (I) and quadrature (Q) phased clocks.

In yet another embodiment, the double balanced gain stage is configured to generate a nearly one-to-one mapping between DAC current and current-mode-logic (CML) AC gain, wherein the nearly one-to-one mapping comprises a gain index on the order of 0.9-1.0.

In a further embodiment, a method for implementing double-balanced sinusoidal mixing phase interpolation comprises: providing a double-balanced gain stage having a first input for receiving a first phasor clock, a second input for receiving a second phasor clock, and a phase interpolator (PI) output, wherein the double-balance gain stage includes (i) a first gain stage having a positive input side and a negative input side for the first phasor clock and (ii) a second gain stage having a positive input side and a negative input side for the second phasor clock; and providing a sinusoidal digital-to-analog (DAC) stage coupled to the double-balanced gain stage and configured to implement sinusoidal weighting of positive and negative sides of differential DAC current for the first phasor clock and positive and negative sides of differential DAC current for the second phasor clock, wherein the sinusoidal weighting provides uniformly spaced phase steps in the phase interpolator (PI) output.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the embodiments of the present disclosure can advantageously extend PI based CDR architecture into 5 Gbps and beyond with comparable performance as phase locked loop CDR and incomparable multi-lane integration desired for SoC. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A double-balanced sinusoidal mixing phase interpolator comprising:
    a double-balanced gain stage comprising:
        a first input for receiving a first differential analog phasor clock signal,
        a second input for receiving a second differential analog phasor clock signal;
        a phase interpolator (PI) differential output having a first terminal and a second terminal;
        a first gain stage comprising:
            a first transistor having a first current electrode coupled to the first terminal of the PI output, a second current electrode, and a control electrode to receive a positive side of the first differential analog phasor clock signal;
            a second transistor having a first current electrode coupled to the second terminal of the PI output, a second current electrode coupled to the second current electrode of the first transistor, and a control electrode to receive a negative side of the first differential analog phasor clock signal;
            a third transistor having a first current electrode coupled to the first terminal of the PI output, a second current electrode, and a control electrode to receive the negative side of the first analog phasor clock signal; and
            a fourth transistor having a first current electrode coupled to the second terminal of the PI output, a second current electrode coupled to the second current electrode of the third transistor, and a control electrode to coupled to receive the positive side of the first differential analog phasor clock signal;
        a second gain stage comprising:
            a fifth transistor having a first current electrode coupled to the first terminal of the PI output, a second current electrode, and a control electrode to receive a positive side of the second differential analog phasor clock signal;
            a sixth transistor having a first current electrode coupled to the second terminal of the PI output, a second current electrode coupled to the second current electrode of the fifth transistor, and a control electrode to receive a negative side of the second differential analog phasor clock signal;
            a seventh transistor having a first current electrode coupled to the first terminal of the PI output, a second current electrode, and a control electrode to receive the negative side of the second differential analog phasor clock signal; and
            an eighth transistor having a first current electrode coupled to the second terminal of the PI output, a second current electrode coupled to the second current electrode of the seventh transistor, and a control electrode to receive the positive side of the second differential analog phasor clock signal; and
    a sinusoidal digital-to-analog (DAC) stage coupled to the double-balanced gain stage and configured to implement sinusoidal weighting of positive and negative sides of first differential DAC current for the first differential analog phasor clock signal and positive and negative sides of second differential DAC current for the second differential analog phasor-clock signal according to a plurality of current adjustment steps, the current adjustment steps having a non-linear relationship, the sum of normalized amplitudes of the first and the second DAC currents being non-unity, wherein the sinusoidal weighting provides uniformly spaced phase steps in the phase interpolator (PI) output.

2. The interpolator of claim 1, wherein the sinusoidal weighting further provides for intrinsic phase step linearity in the phase interpolator (PI) output across 360 degrees.

3. The interpolator of claim 1, the double-balanced gain stage being configured to render a current mode logic (CML) gain of the first and second differential analog phasor clock signals nearly proportional to a current from the sinusoidal DAC stage.

4. The interpolator of claim 1, wherein the first gain stage is configured to provide (i)(a) a positive side of differential DAC current and (i)(b) a negative side of differential DAC current for the first differential analog phasor clock, and wherein the second gain stage is configured to provide (ii)(a) a positive side of differential DAC current and (ii)(b) a negative side of differential DAC current for the second differential analog phasor clock.

5. The interpolator of claim 1, wherein the phase interpolator output comprises (i) a positive output node and (ii) a negative output node.

6. The interpolator of claim 1, wherein the first input includes a positive input node and a negative input node and wherein the second input includes a positive input node and a negative input node.

7. The interpolator of claim 1, further wherein a tail current of the first and second transistors comprises the positive side of the first differential DAC current, a tail current of the third and fourth transistors comprises the negative side of the first differential DAC current, a tail current of the fifth and sixth transistors comprises the positive side of the second differential DAC current, and a tail current of the seventh and eighth comprises the negative side of the second differential DAC current.

8. The interpolator of claim 1, wherein the first and second gain stages are coupled together for mixing the sinusoidally weighted first and second differential analog phasor clock signals.

9. The interpolator of claim 1, wherein the sinusoidal DAC stage includes (i) a first DAC with bit-by-bit complementary current steering switches configured to sinusoidally weight the positive and negative sides of the first differential DAC current and (ii) a second DAC with bit-by-bit complementary current steering switches configured to sinusoidally weight the positive and negative sides of the second differential DAC current.

10. The interpolator of claim 9, wherein the bit-by-bit complementary current steering switches of the first and second DAC are responsive to digital phase control code for rendering the positive and negative sides of the corresponding differential DAC currents.

11. The interpolator of claim 10, wherein the digital phase control code comprises linear code configured to implement phase rotation.

12. The interpolator of claim 11, wherein the linear code comprises thermometer-code with unary weighting.

13. The interpolator of claim 10, wherein the digital phase control code intrinsically includes clock polarity selection for the phase interpolator (PI) output.

14. The interpolator of claim 9, wherein each of the first and second DACs include a plurality of current cells, wherein the plurality of DAC current cells are sinusoidal weighted for providing a sinusoidal current in response to linear digital phase control code, and wherein the first and second DACs each comprises a plurality of complementary current steering switches and a plurality of sinusoidally weighted current cells, wherein the sinusoidal weighting is symmetrical about current cells within the middle of the plurality of current cells, the sinusoidal weighting further including scaling from the middle of the plurality of current cells in a sinusoidal manner to each end of the plurality of cells.

15. The interpolator of claim 1, wherein a first current-steering digital-to-analog converter (DAC) is configured to provide in-phase (I) clock weighting, and a second current-steering digital-to-analog converter (DAC) is configured to provide quadrature (Q) clock weighting.

16. The interpolator of claim 1, wherein the double-balanced gain stage implements sinusoidal mixing of input in-phase (I) and quadrature (Q) phased clocks.

17. The interpolator of claim 1, wherein the double balanced gain stage is configured to generate a nearly one-to-one mapping between DAC current and current-mode-logic (CML) AC gain, wherein the nearly one-to-one mapping comprises a gain index on the order of 0.9-1.0.

18. A method for implementing double-balanced sinusoidal mixing phase interpolation comprising:
providing a double-balanced gain stage having a first input for receiving a first phasor clock, a second input for receiving a second phasor clock, and a phase interpolator (PI) output, wherein the double balanced gain stage includes: a first input for receiving a first differential analog phasor clock signal,
a second input for receiving a second differential analog phasor clock signal;
a phase interpolator (PI) differential output having a first terminal and a second terminal;
a first gain stage comprising:
a first transistor having a first current electrode coupled to the first terminal of the PI output, a second current electrode, and a control electrode to receive a positive side of the first differential analog phasor clock signal;
a second transistor having a first current electrode coupled to the second terminal of the PI output, a second current electrode coupled to the second current electrode of the first transistor, and a control electrode to receive a negative side of the first differential analog phasor clock signal;
a third transistor having a first current electrode coupled to the first terminal of the PI output, a second current electrode, and a control electrode to receive the negative side of the first analog phasor clock signal; and
a fourth transistor having a first current electrode coupled to the second terminal of the PI output, a second current electrode coupled to the second current electrode of the third transistor, and a control electrode to coupled to receive the positive side of the first differential analog phasor clock signal;
a second gain stage comprising:
a fifth transistor having a first current electrode coupled to the first terminal of the PI output, a second current electrode, and a control electrode to receive a positive side of the second differential analog phasor clock signal;
a sixth transistor having a first current electrode coupled to the second terminal of the PI output, a second current electrode coupled to the second current electrode of the fifth transistor, and a control electrode to receive a negative side of the second differential analog phasor clock signal;
a seventh transistor having a first current electrode coupled to the first terminal of the PI output, a second current electrode, and a control electrode to receive the negative side of the second differential analog phasor clock signal; and
an eighth transistor having a first current electrode coupled to the second terminal of the PI output, a second current electrode coupled to the second current electrode of the seventh transistor, and a control electrode to receive the positive side of the second differential analog phasor clock signal; and
providing a sinusoidal digital-to-analog (DAC) stage coupled to the double-balanced gain stage and configured to implement sinusoidal weighting of positive and negative sides of first differential DAC current for the first differential analog phasor clock signal and positive and negative sides of second differential DAC current for the second differential analog phasor clock signal according to a plurality of current adjustment steps, the current adjustment steps having a non-linear relationship, the sum of normalized amplitudes of the first and the second DAC currents being non-unity, wherein the sinusoidal weighting provides uniformly spaced phase steps in the phase interpolator (PI) output.

* * * * *